United States Patent
Ozkan et al.

(10) Patent No.: US 6,531,369 B1
(45) Date of Patent: Mar. 11, 2003

(54) HETEROJUNCTION BIPOLAR TRANSISTOR (HBT) FABRICATION USING A SELECTIVELY DEPOSITED SILICON GERMANIUM (SIGE)

(75) Inventors: Cengiz S. Ozkan, La Jolla, CA (US); Abderrahmane Salmi, Temecula, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 10/075,700

(22) Filed: Feb. 14, 2002

Related U.S. Application Data

(62) Division of application No. 09/517,093, filed on Mar. 1, 2000, now abandoned.

(51) Int. Cl.[7] .............................................. H01L 21/331
(52) U.S. Cl. ....................... 438/312; 438/235; 438/320; 438/345; 438/364
(58) Field of Search ................................. 438/235, 309, 438/312, 320, 345, 350, 364

(56) References Cited

U.S. PATENT DOCUMENTS

| | | | | |
|---|---|---|---|---|
| 5,177,583 A | * | 1/1993 | Endo et al. ................. 257/190 |
| 5,440,152 A | * | 8/1995 | Yamazaki ................... 257/197 |
| 5,567,961 A | * | 10/1996 | Usagawa et al. ........... 257/197 |
| 5,583,059 A | * | 12/1996 | Burghartz ..................... 437/31 |
| 5,629,556 A | * | 5/1997 | Johnson ...................... 257/592 |
| 5,633,179 A | * | 5/1997 | Kamins et al. ............. 438/318 |
| 5,656,514 A | | 8/1997 | Ahlgren et al. |
| 5,668,396 A | * | 9/1997 | Sato ............................ 257/517 |
| 5,693,979 A | * | 12/1997 | Sato ............................ 257/588 |
| 5,698,890 A | * | 12/1997 | Sato ............................ 257/592 |
| 5,798,561 A | * | 8/1998 | Sato ............................ 257/588 |
| 5,804,487 A | | 9/1998 | Lammert |
| 5,834,800 A | | 11/1998 | Jalali-Farahani et al. |
| 5,886,395 A | * | 3/1999 | Katsummata et al. ....... 257/585 |

* cited by examiner

*Primary Examiner*—Eddie Lee
*Assistant Examiner*—N. Drew Richards
(74) *Attorney, Agent, or Firm*—Gray Cary Ware & Freidenrich; Terrance A. Meador

(57) ABSTRACT

A Heterojunction Bipolar Transistor (HBT) is provided where the SiGe base region is formed through selective deposition, after the formation of the base electrode layer and the emitter window. A sacrificial oxide layer is deposited between the collector and base electrode. The contact to the SiGe base is made at an extrinsic area, underneath the base electrode, after removal of the sacrificial oxide. The SiGe is covered with a temporary oxide layer during further processes, and this protective layer is removed immediately before the deposition of the emitter material. The selective deposition of the SiGe at a relatively late stage of the fabrication process helps insure that the film remains free of the stresses which can degrade electron mobility. A process of fabricating the above-described HBT device is also provided.

14 Claims, 7 Drawing Sheets

HETEROJUNCTION BIPOLAR TRANSISTOR (HBT) FABRICATION USING A SELECTIVELY DEPOSITED SILICON GERMANIUM (SIGE)

This application is a divisional of U.S. patent application Ser. No. 09/517,093, filed Mar. 1, 2000 now abandoned.

BACKGROUND OF THE INVENTION

This invention generally concerns Heterojunction Bipolar Transistors (HBT)s and, more particularly, a HBT device formed through the selective deposition of silicon germanium (SiGe) in the base region.

Rapid progress has occurred in the development of high performance bipolar and BiCMOS integrated circuits for applications such as high speed data and RF wireless communications. SiGe heterojunction bipolar technology offers economically feasible solutions with comparable performance characteristics to III–V technologies. The critical performance criteria include high frequency performance, low noise at both low and high frequency, sufficiently high intrinsic gain, and high breakdown voltages.

The integration of SiGe into the silicon bipolar base processing has been of interest because of the resulting improvements in electrical properties such as transmit frequency (Ft), Early voltage (Va), and collector-to-emitter breakdown (BVceo). The band gap at the collector side can be reduced by substituting germanium (Ge) for silicon (Si) in the base region of a bipolar transistor. This results in an electric field in the base, which reduces the majority carriers transit time through the base. SiGe films can be integrated into silicon processing with much less difficulty than other materials. However, even the use of structurally similar materials, such as Si and Ge, results in lattice mismatches on the crystal boundary area. Further, the formation of very thin base regions is complicated by the fact that boron implantation, even at an energy as low as 5 Kev, can still penetrate 1000 Å, into the base collector junction.

Different techniques have been proposed to integrate SiGe into the base of a bipolar device. These techniques are classified into two categories: blanket SiGe film deposition and selective SiGe film deposition. The blanket SiGe deposition method produces less silicon defects, and, therefore, higher yields. Thin, heavily doped, film can be produced with this method using growth rates of 25 to 100 Å per minute. However, blanket deposition processes are difficult to integrate into standard bipolar fabrication processes. Undesired areas of SiGe cannot easily be etched away without damaging the thin, intended base region. Although nonselective deposition is less complicated in terms of nucleation, microloading effects and faceting, it has to be done at an earlier state in the front-end fabrication sequence for patterning purposes. The stability of the film is frequently compromised due to the number of thermal cycling and etching steps, excessive dopant out-diffusion, and defect formation.

Alternately, selective deposition techniques can be used to form the base electrode and base region underlying the emitter. Selective deposition process can be used to grow SiGe only on silicon areas, so that the process is self-aligned. Selective deposition can be done at a later stage which makes its integration much less complicated. The process is less complicated because post-deposition patterning is not required, the process is self-aligned, and extraneous thermal cycles are avoided. Although selective SiGe film deposition is conceptually simple, there are problems concerning the connection of the SiGe base to the base electrodes, and with defect formation near the emitter-base junction. However, if these particular problems could be solved, the selective deposition of SiGe in the fabrication of HBTs would result in higher yields and better electrical performance.

It would be advantageous if an HBT base region could be reliably fabricated using a selective SiGe deposition, at a later stage in the fabrication sequence, to minimize exposure of the SiGe layer to undesired heat cycles and chemical processes.

It would be advantageous if a SiGe base could be self-aligned, and formed without the necessity of post-deposition patterning.

It would be advantageous if a selectively deposited SiGe base could be formed subsequent to the formation of the base electrode layer to avoid annealing and chemical etch processes which act to degrade a SiGe film.

It would be advantageous if a selectively deposited SiGe base could be protected during the formation of the emitter window to prevent defects along the emitter-base junction.

SUMMARY OF THE INVENTION

A Heterojunction Bipolar Transistor is provided comprising:
- a collector region;
- a silicon germanium (SiGe) base region overlying the collector region;
- a silicon base electrode at least partially overlying an extrinsic region of the base region; and
- an contact, connecting the extrinsic region of the base region to the base electrode.

A sacrificial oxide layer temporarily overlies the collector region and underlies the silicon base electrode. After etching, an extrinsic region of the base is formed in the region temporarily occupied by the sacrificial oxide layer.

In some aspects of the invention the base region has a SiGe bottom surface and a SiGe top surface, and further comprises:
- a bottom silicon cap layer separating the collector region and the SiGe bottom surface; and
- a top silicon cap layer separating the SiGe top surface from the emitter region. Then, the protective oxide layer is formed by oxidizing the top Si-cap.

The HBT also has dielectric sidewalls to define the emitter electrode, and include a window between the emitter electrode and the base region top surface. The temporary protective oxide layer is formed after the SiGe deposition, and is removed after the formation of the dielectric sidewalls, before the formation of the emitter region.

A method for fabricating an HBT is also provided comprising:
- selectively depositing a silicon germanium (SiGe) composition to form a base region with a top surface;
- forming a protective layer of oxide overlying the base region top surface;
- forming dielectric sidewalls to define an emitter region;
- etching to remove the protective oxide layer overlying the base region top surface; and
- forming an emitter overlying the base region.

The contact from the SiGe base region to the base electrode is made by depositing a sacrificial layer of oxide overlying the gate oxide layer;
- depositing a layer of silicon overlying the sacrificial layer of oxide, forming a base electrode;

depositing a layer of nitride overlying the silicon layer;

depositing a layer of TEOS overlying the nitride layer, forming a TEOS/nitride/silicon stack;

patterning an emitter window in the TEOS/nitride/silicon stack; and etching the sacrificial oxide layer to form an undercut between the underlying silicon collector region, and the overlying base electrode.

The selective deposition of SiGe includes filling the undercut formed between the silicon collector region and the base electrode, forming an extrinsic contact with the overlying silicon layer. Typically, the SiGe layer is graded with respect to Ge content.

Some aspects of the invention further comprise:

depositing a silicon bottom cap layer to separate the collector region from the base region, and depositing a silicon top cap layer overlying the SiGe. The formation of the protective oxide layer typically involves oxidizing the silicon top cap overlying the SiGe base region. A high-pressure low-temperature (HIPOX) process oxidizes the base region top surface at a temperature in the range of 600 to 700 degrees C., and a pressure in the range of 10–25 atmospheres. The resulting oxide layer has a thickness in the range of 50 to 250 Angstroms (Å). Alternately, a Si-cap is not used, and the top surface of the SiGe base is oxidized.

DETAILED DESCRIPTION OF THE PREFERRED EMBODIMENT

In following description, manufacturing steps are described with enough detail to show relationships between elements of the completed device. Many fabrication details are omitted from this description, with the understanding that those skilled in the art may employ as many of those details as are called for in any particular design. Moreover, when description is given in this application of fabrication steps, those skilled in the art will realize that each such step may actually comprise one or more discrete steps and that other steps, not described herein, may be necessary to achieve specific applications of the invention.

Figure 1:
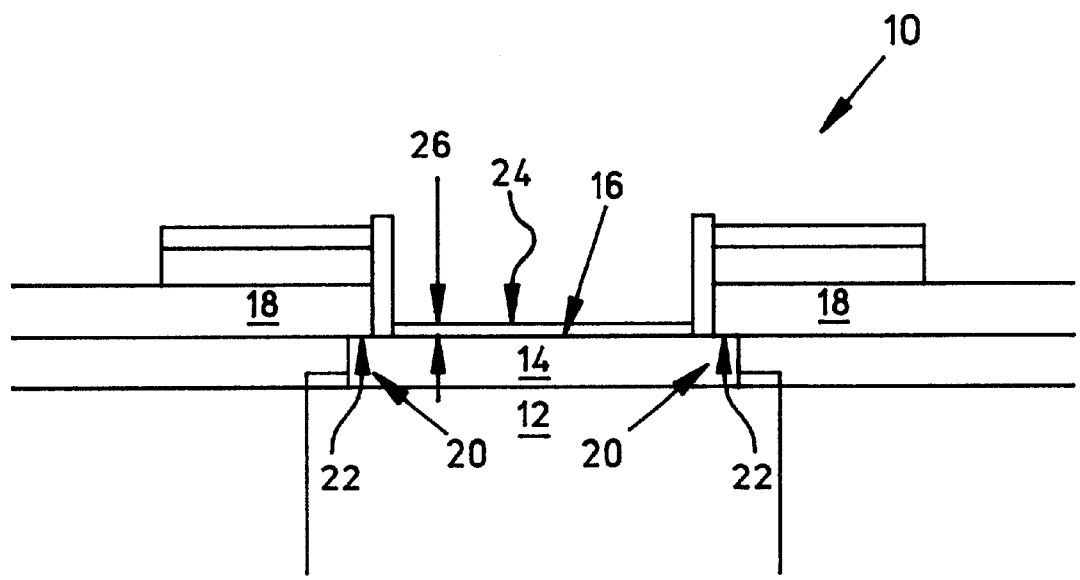
FIGS. 1 through 3 illustrate a Heterojunction Bipolar Transistor (HBT) of the present invention.

FIGS. 1 through 3b illustrate a Heterojunction Bipolar Transistor (HBT) of the present invention. Referring to FIG. 1, the HBT 10 comprises a collector region 12, and a base region 14 having a top surface 16 overlying the collector region 12. The base region 14 includes silicon germanium (SiGe). A silicon base electrode 18 at least partially overlies an extrinsic region 20 of the base region 14. A contact 22 connects the extrinsic region 20 of the base region 14 to the base electrode 18.

A temporary protective oxide layer 24 overlies the base region top surface 16. The protective oxide layer 24 is formed by oxidizing the base region top surface 16 at a temperature in the range of 600 to 700 degrees C., and a pressure in the range of 10–25 atmospheres. The low temperature oxidation of the base region top surface 16 includes forming the protective oxide layer 24 to a thickness 26 in the range of 50 to 250 Angstroms (Å). Alternately, the protective oxide layer 24 is formed by depositing a thin layer of oxide through a chemical vapor deposition (CVD) process.

Figure 2:
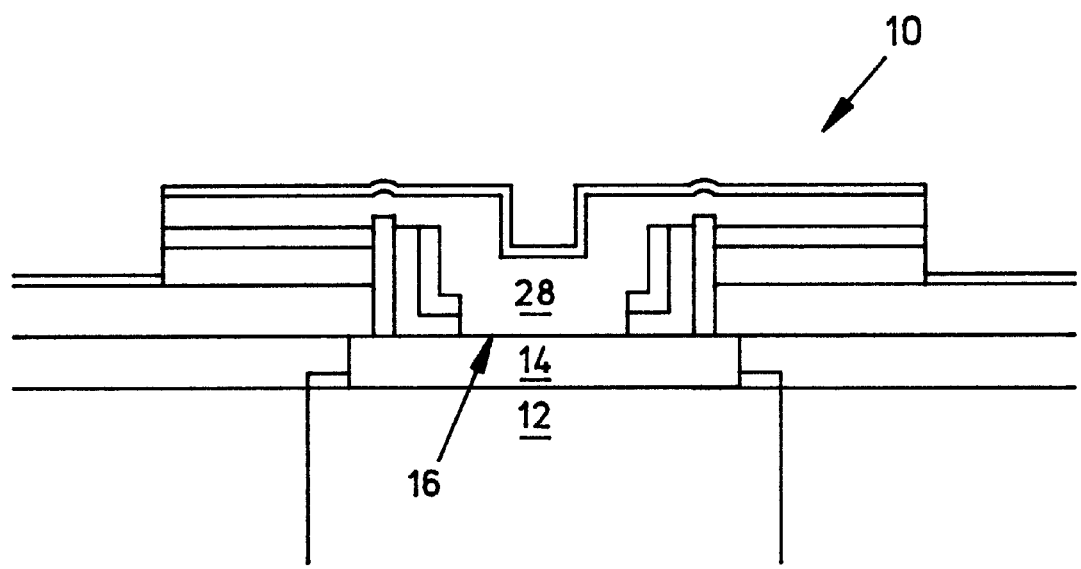

Referring to FIG. 2, an emitter region 28 overlies the base region top surface 16. As is explained in detail below, the temporary protective oxide layer 24 (see FIG. 1) is removed before the formation of the emitter region 28.

Figure 3:
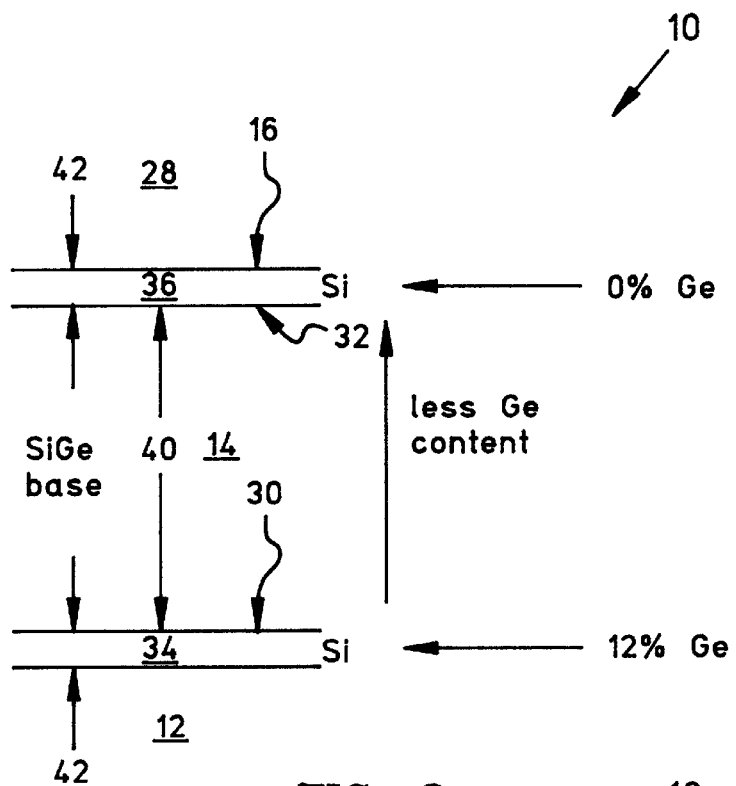

FIG. 3 is a more detailed depiction of the HBT base region 14 of FIG. 2. In some aspects of the invention the base region 14 has a SiGe bottom surface 30 and a SiGe top surface 32. A bottom silicon cap layer 34 separates the collector region 12 and the SiGe bottom surface 30. A top silicon cap layer 36 separates the SiGe top surface 32 from the emitter region 28. The base region 14 has a thickness 40 in the range of approximately 500 to 1000 Å.

When the top Si-cap 36 is used, the top surface 16 of the base region is defined herein as the top surface of Si-cap 36. Likewise, when the top surface 16 of the base region 14 is oxidized to form protective oxide layer 24, it is the top Si-cap 36 that is oxidized. Si-caps 34 and 36 have thicknesses 42 in the range of 100 to 300 Å. Alternately, either the bottom 34, or a top Si-cap 36 may be used without the other.

In some aspects of the invention the SiGe base region 14 is graded with respect to the Ge content, with less Ge content in progression from the SiGe bottom 30 to the SiGe top 32 surfaces. Typically, the Ge content of the SiGe base region 14 varies from 20 to 0%. In a preferred aspect of the invention, the Ge content progressively decreases from 12% at the SiGe bottom surface 30 to 0% at the SiGe top surface 32. The addition of Ge acts to decrease the bandgap across the base. The grading of the Ge creates a bandgap that is not constant. The built-in drift field resulting from the grading speeds cars across the bandgap gradient. Further, the grading acts to reduce film stress by reducing lattice mismatch, especially along the emitter-base junction. Note, the above-described Ge grading of the SiGe base region 14 may occur with, or without the use of Si-caps 34 and 36.

Figure 4:
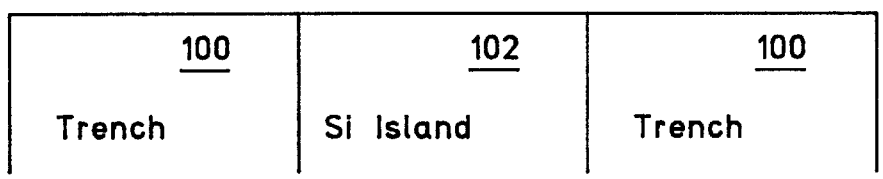
FIGS. 4–11 depict detailed steps in the formation of a completed HBT device in accordance with the present invention.

FIGS. 4–11 depict detailed steps in the formation of a completed HBT device 10 in accordance with the present invention. FIG. 4 depicts a conventional front-end bipolar process (prior art). An N+ buried layer is formed via implantation of a dopant such as arsenic or antimony and a high temperature drive. An N-Epi layer is deposited and doped in-situ with arsenic to form collector region. Device isolation is achieved by forming deep and shallow trenches 100. Deep trench isolation is conducted first, and consists of forming deep and high aspect ratio grooves in the silicon 5–10 microns deep. The walls of deep trenches 100 are oxidized (500–1500 Å thermal oxide) and then the trenches are filled with poly-Si. Planarization is made via blanket etchback of the poly-silicon layer or using chemo-mechanical polish (CMP). The oxide is wet etched, and a stack of nitride (500–2000 Å)/oxide (250–1000 Å) layers is deposited and patterned. Shallow trenches 100 are etched (1–2 microns) and then the trench walls are oxidized (500–1500Å). Next, nitride is removed (wet etch) and the trenches 100 are filled with tetraethylorthosilicate (TEOS). Planarization is made by a combination of resist etchback and spin-on glass (SOG) etchback to expose the device areas.

Figure 5:
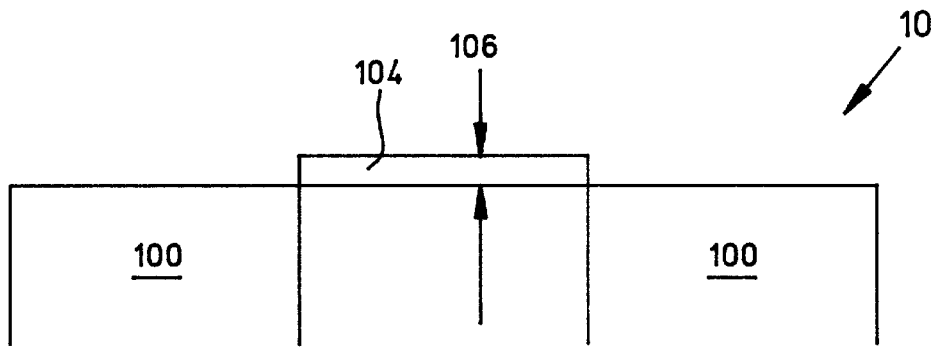

FIG. 5 illustrates the HBT 10 of FIG. 4 following the deposition of a thin gate oxide 104 (prior art). The gate oxide 104 is grown to a thickness 106 of 50–200 Å.

Figure 6:
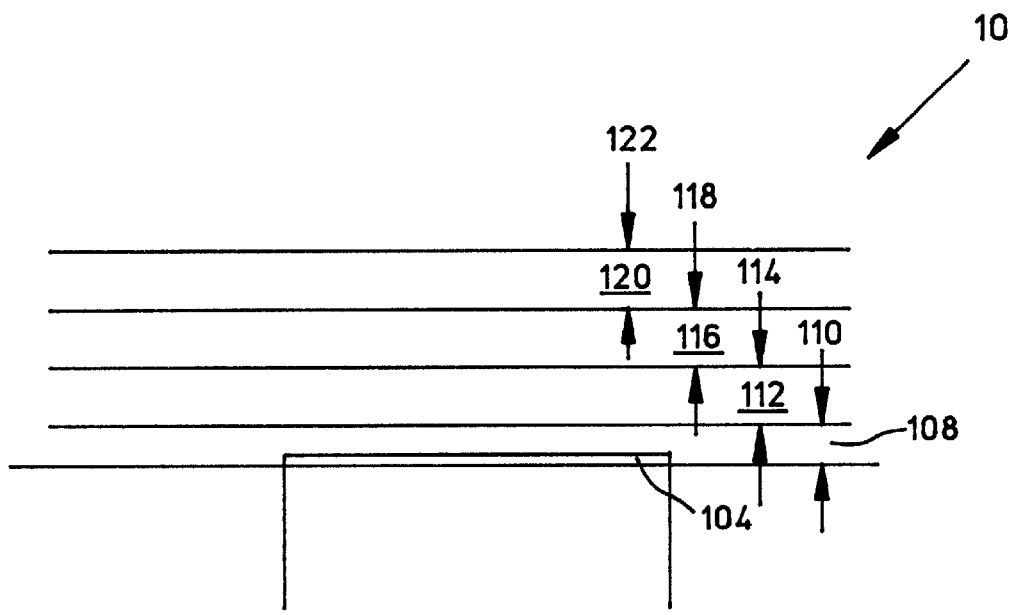

FIG. 6 illustrates the HBT 10 of FIG. 5 following the formation of a sacrificial CVD oxide deposition 108. Sacrificial oxide layer 108 has a thickness 110 in the range of 250 to 600 Å. The CVD oxide layer 108 is later etched to expose a cavity for SiGe deposition. First, however, a stack is deposited on oxide layer 108 of poly-silicon 112, having a thickness 114 of 1000–3000 Å, followed by CVD nitride layer 116, having a thickness 118 of 1000–4000 Å, followed by a TEOS layer 120, having a thickness 122 of 1000–4000 Å.

Figure 7:
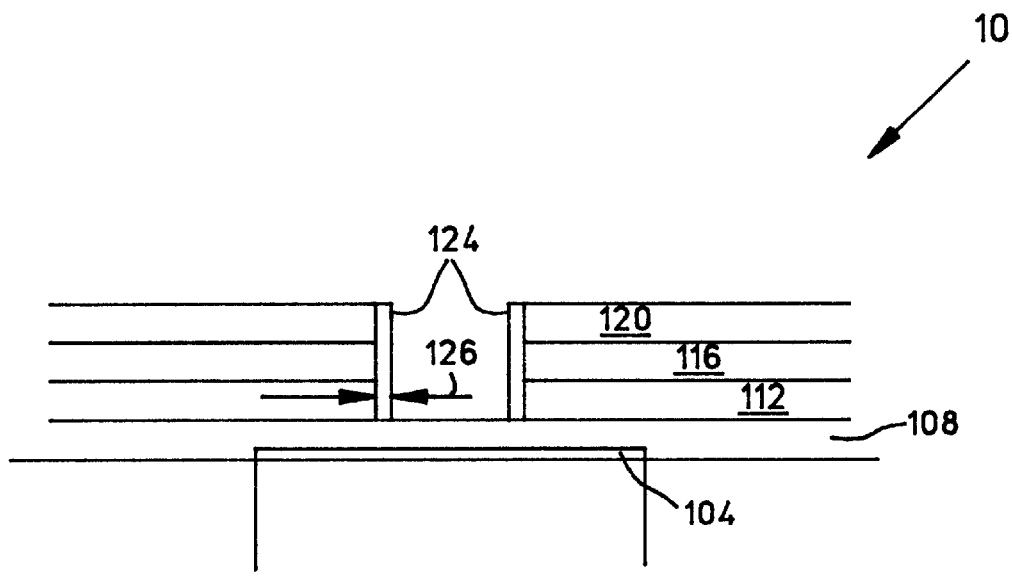

FIG. 7 illustrates the HBT 10 of FIG. 6 following emitter window patterning. The TEOS 120/nitride 116 stack is etched in plasma using $CF_4/CHF_3$ chemistry. Then, the poly-silicon layer 112 is etched using $Cl_2$ chemistry. Photoresist is stripped and then a CVD nitride spacer 124, having a thickness 126 of 250–750 Å, is formed through blanket deposition and etchback. The TEOS layer 120 on top of the stack acts as an etch stop layer during nitride spacer 124 etchback.

Figure 8:
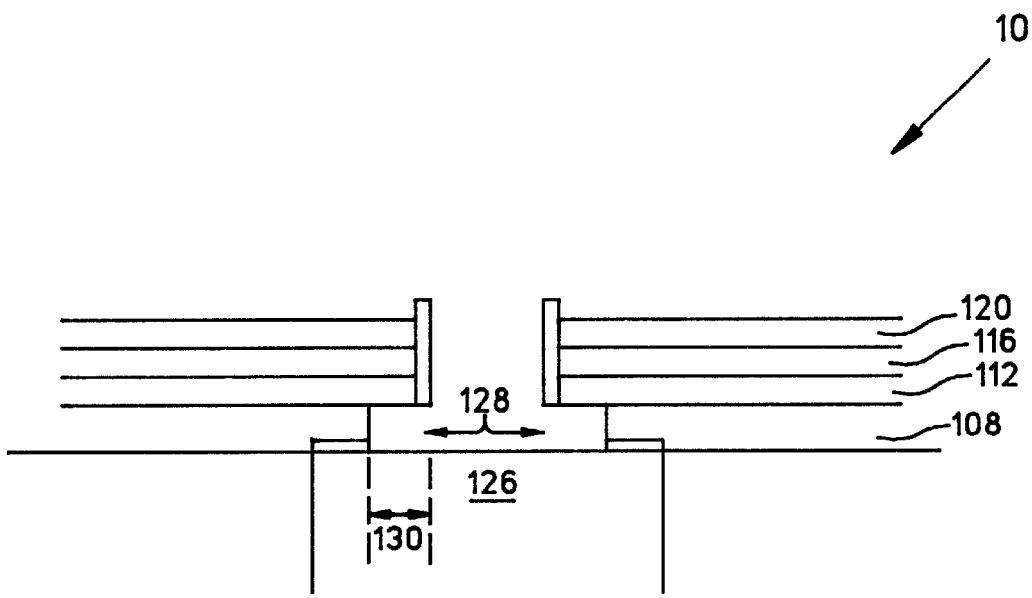

FIG. 8 illustrates the HBT 10 of FIG. 7 following an oxide etch. The sacrificial oxide layer 106 temporarily overlies the collector region 126 and underlies the silicon base electrode 112. The sacrificial CVD oxide 108 over the device collector area 126 is set etched in 10:1 (DI:HF) and a cavity is exposed via oxide undercut 128, to a distance 130 of 500 Å to 2500 Å, to realize overhanging in the base poly-silicon layer 112. This is a very critical step of the whole fabrication which will determine the contact between the subsequently formed base SiGe layer and the extrinsic base poly-silicon layer 112. Wet etching of the sacrificial oxide 108 immediately precedes the SiGe deposition to ensure passivation of the exposed silicon regions 126.

Figure 9:
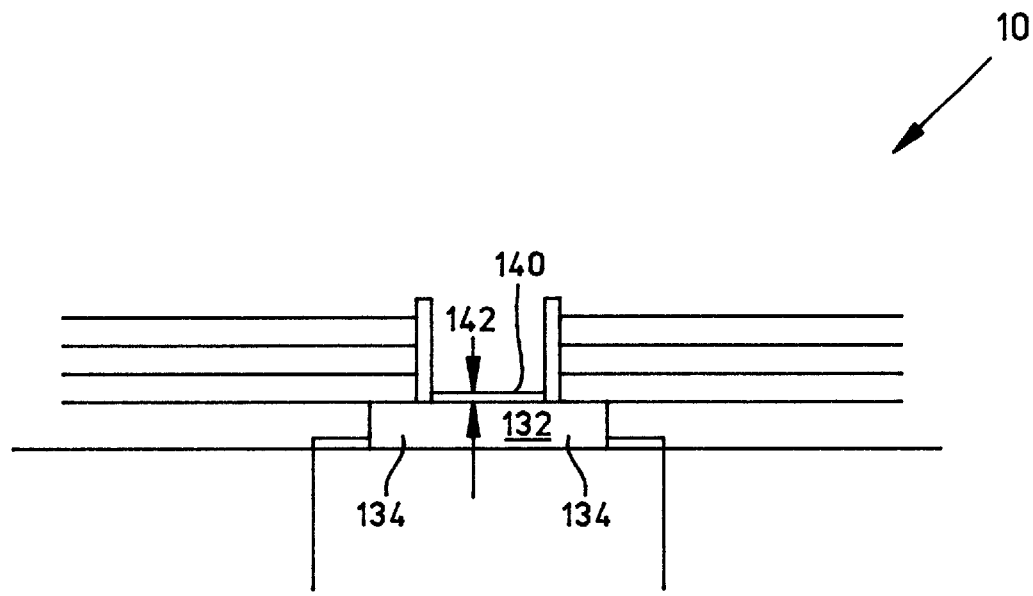

FIG. 9 illustrates the HBT 10 of FIG. 8 following the deposition of SiGe. SiGe selective deposition 132 is conducted with a DCS (dichlorosilane) or $DCS/Cl_2$ chemistry, which prevents nucleation over dielectrics 124. An extrinsic region 134 of the base 132 is formed in the region temporarily occupied by the sacrificial oxide layer 108. Typically, the selective SiGe deposition includes depositing a stack which includes a bottom Si-cap 34, an intrinsic SiGe, a boron doped SiGe, an intrinsic SiGe, and a top Si-cap layer 36, see FIG. 3. The SiGe layers are either graded or fixed (box) in germanium content. The thickness, germanium content, profile (box or graded) and the boron doping level are extremely important in determining the final electrical properties of the device. Above, is describes just one conventional technique of doping the base region. The present invention is enabled with all convention doping techniques used to form base electrodes.

When a top Si-cap layer 36 is used, it is oxidized to form an oxide layer 140 having a thickness 142 of 50 Å to 250 Å, using high pressure-low temperature oxidation (HIPOX, 10–25 atm, 600–700 C.) for protection purposes. Alternately, oxide layer 140 is formed by a thin CVD oxide deposition. In another alternative, oxide layer 140 is formed without Si-cap 36.

Figure 10:
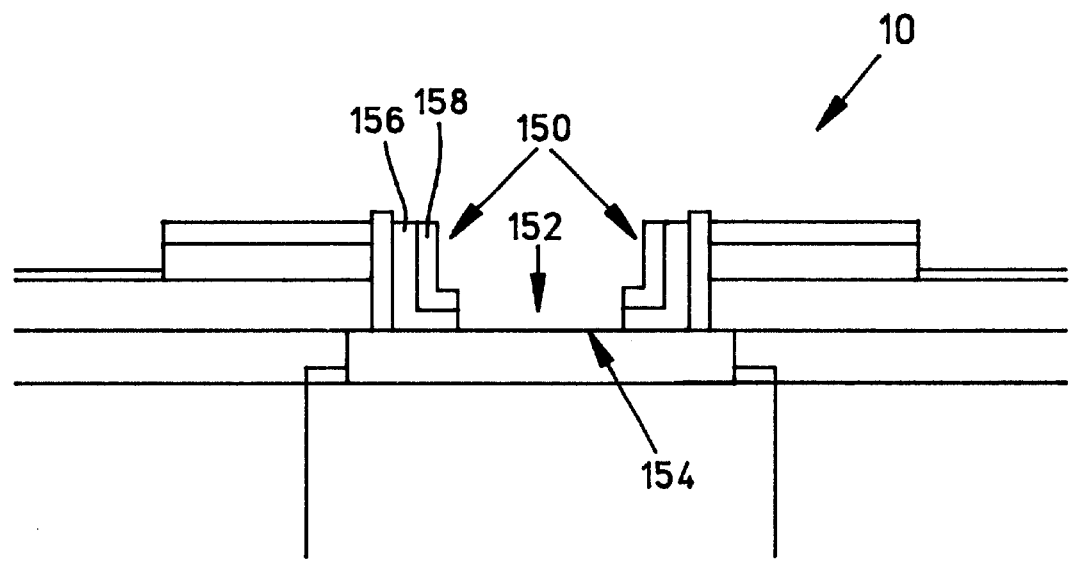

FIG. 10 illustrates the HBT 10 of FIG. 9 following the formation of dielectric sidewalls. The dielectric sidewalls 150 define the subsequently deposited emitter electrode, and a window 152 between the emitter electrode and the base region top surface 154. Referring briefly to FIG. 9, the temporarily protective oxide layer 140 is removed after the formation of the dielectric sidewalls 150. An L-shaped nitride 158/oxide 156 spacer avoids emitter plugging effects when using arsenic implant for doping the subsequently deposited emitter poly-silicon layer.

Figure 11:
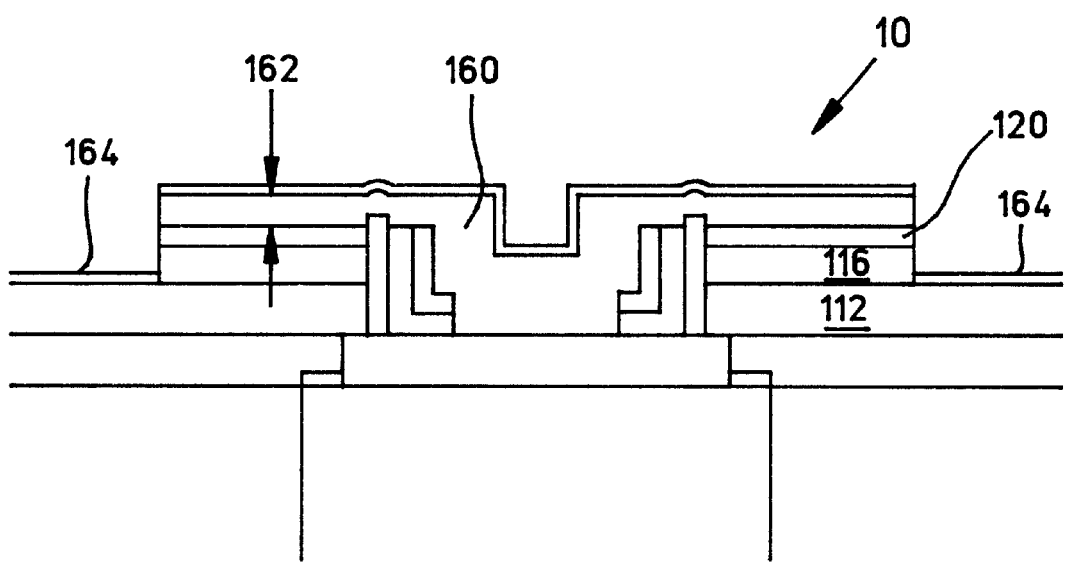

FIG. 11 illustrates the HBT 10 of FIG. 10 following the formation of the emitter. The HIPOX layer 140 is wet etched by a quick HF dip and emitter poly-silicon 160 is deposited to a thickness 162 of 1500–2500 Å. Arsenic is then implanted (1e16 to 2e16 at/$cm^2$ dose) followed by thin CVD nitride deposition (500–1500 Å). A furnace anneal is then performed to drive the emitter dopant (675–775 C.) followed by a rapid thermal anneal for dopant activation (900–975 C.). The emitter window is patterned and the poly-silicon/TEOS/nitride 160/120/116 stack is etched to expose the base poly-silicon layer 112. This is followed by platinum deposition 164 and furnace silicidation anneal. The non-reacted platinum is wet etched in Aqua Regia solution.

Figure 12A:
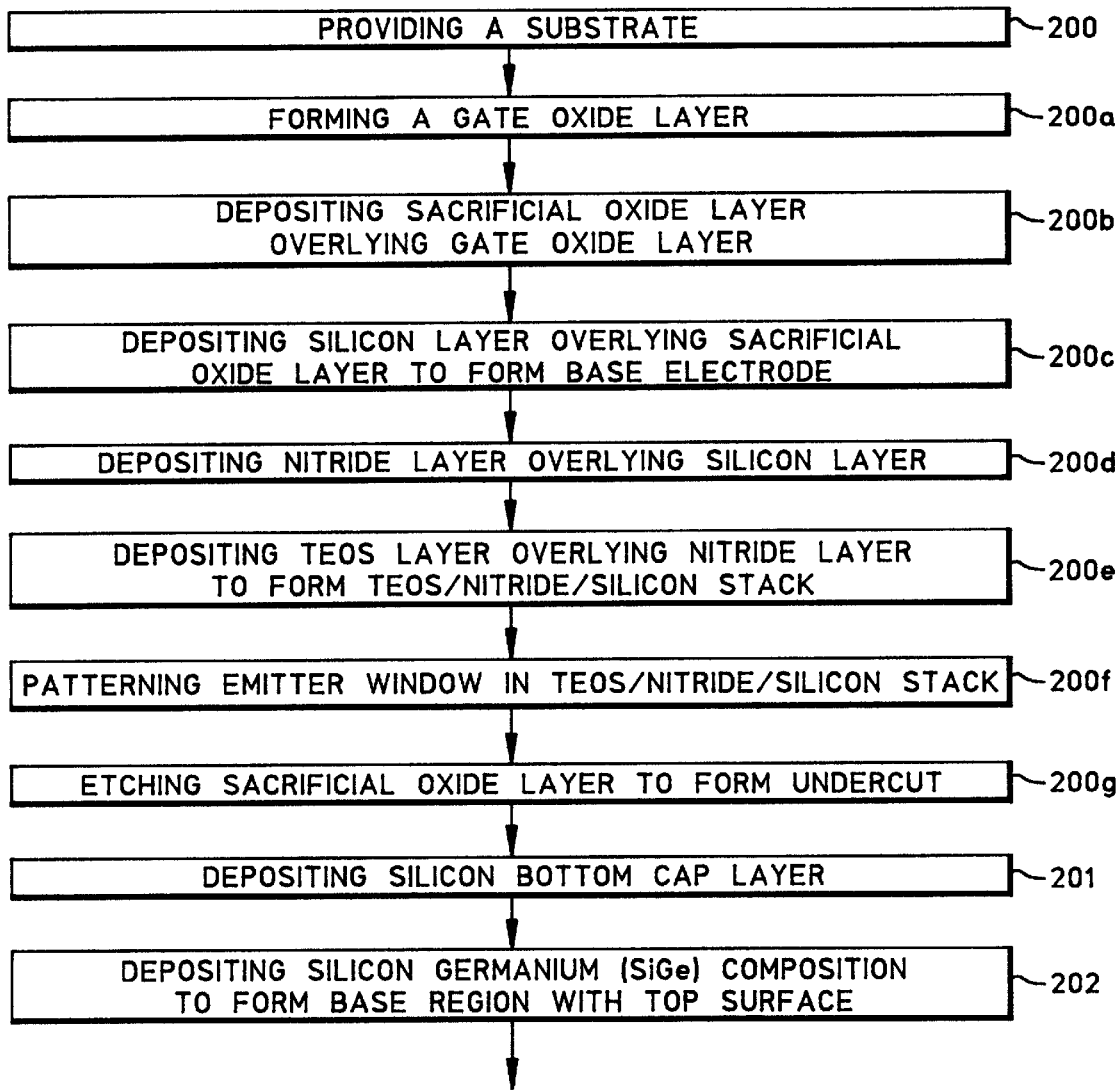
FIG. 12 illustrates steps in a method for fabricating a Heterojunction Bipolar Transistor (HBT).
Figure 12B:
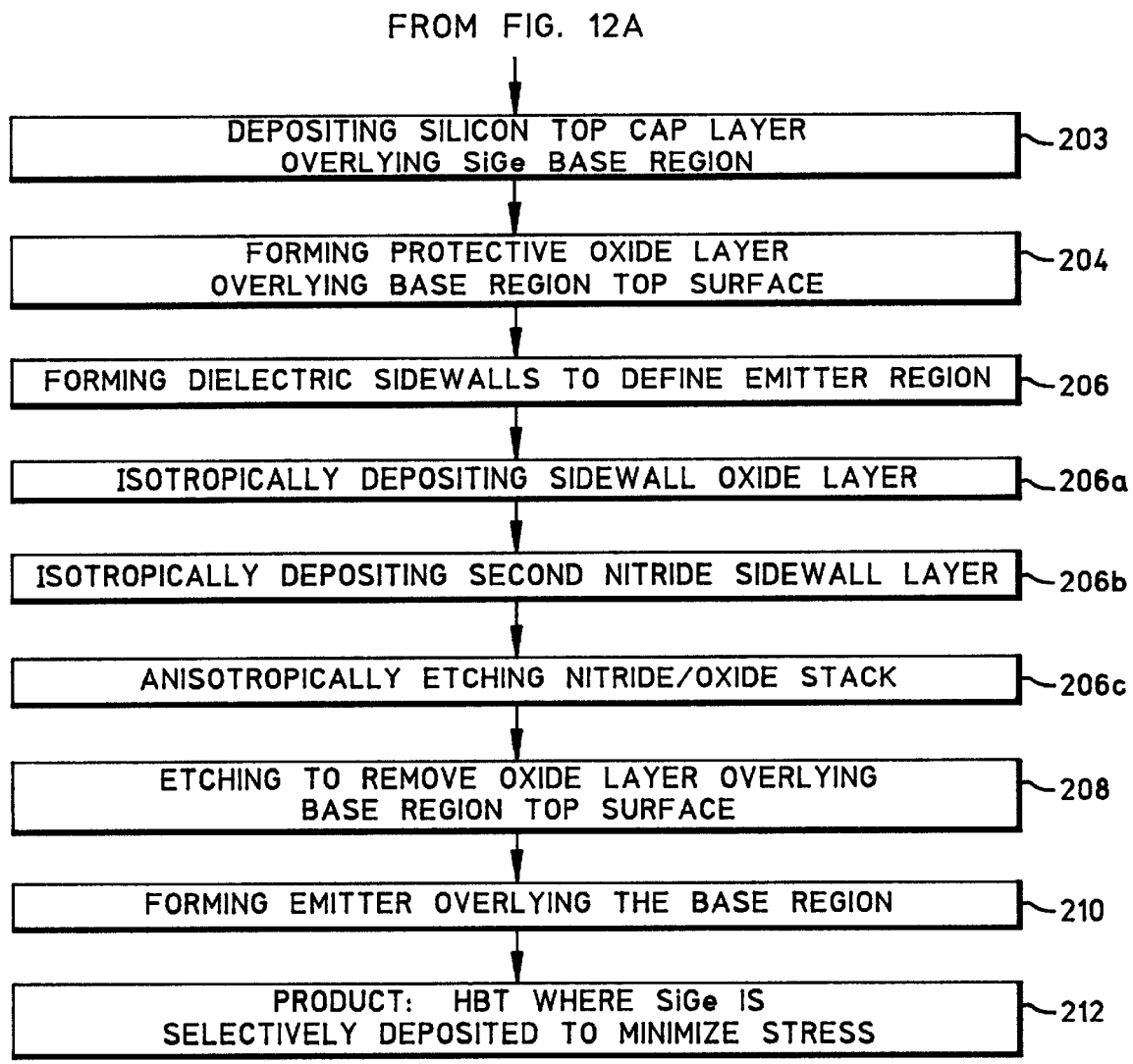

FIG. 12 illustrates steps in a method for fabricating a Heterojunction Bipolar Transistor (HBT). Although the invention is presented as a series of numbered steps for the purpose of clarity, no order should be inferred from the numbering unless explicitly stated. Step 200 provides a substrate, including a lightly doped collector region. Step 202 selectively deposits a silicon germanium (SiGe) composition to form a base region with a top surface. Step 204 forms a protective layer of oxide overlying the base region top surface. Step 206 forms dielectric sidewalls to define an emitter region. Step 208 etches to remove the protective oxide layer overlying the base region top surface. Step 210 forms an emitter overlying the base region. Step 212 is a product, an HBT where the SiGe base has been selectively deposited to minimize film stress.

Preceding the selective SiGe deposition in Step 202, Step 200a forms a gate oxide layer. Step 200b deposits a sacrificial layer of oxide overlying the gate oxide layer. Step 200c deposits a layer of silicon overlying the sacrificial layer of oxide, forming a base electrode. Step 200d deposits a layer of nitride overlying the silicon layer, and Step 200e deposits a layer of TEOS overlying the nitride layer, forming a TEOS/nitride/silicon stack. Step 200f patterns an emitter window in the TEOS/nitride/silicon stack. The formation of the dielectric sidewalls in Step 206 includes forming first nitride sidewalls adjoining the TEOS/nitride/silicon stack, following the patterning of the emitter window in the TEOS/nitride/silicon stack. Step 200g etches the sacrificial oxide layer to form an undercut between the underlying silicon collector region, and the overlying base electrode. An undercut is also formed between the collector region and the overlying first nitride sidewalls.

Some aspects of the invention comprise further steps. Step 201 deposits a silicon bottom cap layer to separate the collector region from the base region. Following the selective deposition of SiGe in Step 202, Step 203 deposits a silicon top cap layer overlying the SiGe base region, forming a base region top surface. When a top Si-cap is provided in Step 203, the formation of the protective oxide layer overlying the base region top surface in Step 204 includes oxidizing the silicon top cap overlying the SiGe base region. The Si-cap layers of Step 201 and 203 typically have a thickness of 100 to 300 Å, and are deposited with a low pressure (LP)CVD process.

The selective deposition of SiGe in Step 202 includes using a chemistry selected from the group consisting of dichlorosilane (DCS) and $DCS/Cl_2$ to fill the undercut formed between the silicon collector region and the base electrode, forming an extrinsic contact with the overlying silicon layer. As explained above in the description of FIG. 3, the selective deposition of SiGe includes forming a base region with area having no Ge content, or forming a SiGe base region that is graded with respect to Ge content. The selective deposition of SiGe in Step 202 includes the Ge content varying from 20% to 0%. In some aspects of the invention Step 200 provides the SiGe base region with a SiGe bottom surface adjacent the collector and a SiGe top surface. Then, the selective deposition of SiGe in Step 202 includes progressively varying the Ge content from 12% at the SiGe bottom surface to 0% at the SiGe top surface. The selectively deposited SiGe is deposited to a thickness in the range of 500 to 1000 Å. A boron dopant is typically used at a concentration of 2e18 to 1e19. The deposition temperature is typically in the range of 600 to 725 degrees C.

With respect to Step 204, the formation of the protective oxide layer overlying the base region top surface includes oxidizing the base region top surface at a temperature in the range of 600 to 700 degrees C. and a pressure in the range of 10–25 atmospheres. The base region top surface is oxidized to form a layer having a thickness in the range of 50 to 250 Å. Alternately, the formation of the protective oxide layer overlying the base region top surface in Step 204 includes depositing a thin layer of oxide through a chemical vapor deposition (CVD) process.

Following the formation of the protective layer in Step 204, the formation of dielectric sidewalls in Step 206 includes sub-steps. Step 206a isotropically deposits a sidewall oxide layer. Step 206b isotropically deposits a second nitride sidewall layer, forming a nitride/oxide stack. Step 206c anisotropically etches the nitride/oxide stack to form an emitter opening with nitride/oxide sidewalls.

The formation of the emitter in Step 210 includes sub-steps (not shown). Step 210a deposits silicon in the emitter well overlying the base region top surface. Step 210b implants dopant in the emitter silicon. Step 210c anneals the emitter, and Step 210d forms contacts to the base electrode.

While only certain preferred features of this invention have been shown by way of illustration, many changes and modifications will occur to those skilled in the art. Accordingly, it is to be understood that the appended claims are intended to cover all such modifications and changes as fall within the true spirit and scope of the invention.

What is claimed is:

1. A method for fabricating a Heterojunction Bipolar Transistor (HBT) comprising:
   providing a lightly doped silicon collector region;
   depositing a silicon bottom cap layer to separate the collector region from a base region;
   selectively depositing a silicon germanium (SiGe) composition to form the base region;
   depositing a silicon top cap layer overlying the SiGe base region, forming a base region top surface;
   forming a protective layer of oxide overlying the base region top surface, including oxidizing the silicon top cap layer;
   forming dielectric sidewalls to define an emitter region;
   etching to remove the protective oxide layer overlying the base region top surface; and
   forming an emitter overlying the base region.

2. The method of claim 1 further comprising:
   preceding the selective SiGe deposition, forming a gate oxide layer;
   depositing a sacrificial layer of oxide overlying the gate oxide layer;
   depositing a layer of silicon overlying the sacrificial layer of oxide, forming a base electrode;
   depositing a layer of nitride overlying the silicon layer; and
   depositing a layer of TEOS overlying the nitride layer, forming a TEOS/nitride/silicon stack.

3. The method of claim 2 further comprising:
   patterning an emitter window in the TEOS/nitride/silicon stack;
   in which the formation of the dielectric sidewalls includes forming first nitride sidewalls adjoining the TEOS/nitride/silicon stack, following the patterning of the emitter window in the TEOS/nitride/silicon stack; and
   further comprising:
   etching the sacrificial oxide layer to form an undercut between the underlying silicon collector region and the overlying base electrode.

4. The method of claim 3 in which the selective deposition of SiGe includes using a chemistry selected from the group consisting of dichlorosilane (DCS) and DCS/Cl$_2$ to fill the undercut formed between the silicon collector region and the base electrode, forming an extrinsic contact with the overlying silicon layer.

5. The method of claim 4 in which the selective deposition of SiGe includes forming a base region with areas having no Ge content.

6. The method of claim 4 in which the selective deposition of SiGe includes forming a SiGe base region that is graded with respect to Ge content.

7. The method of claim 6 in which the selective deposition of SiGe includes the Ge content varying from 20% to 0%.

8. The method of claim 7 wherein the SiGe base region has a SiGe bottom surface adjacent the collector and a SiGe top surface, and in which the selective deposition of SiGe includes progressively varying the Ge content from 12% at the SiGe bottom surface to 0% at the SiGe top surface.

9. The method of claim 4 in which the formation of the protective oxide layer overlying the base region top surface includes oxidizing the base region top surface at a temperature in the range of 600 to 700 degrees C., and a pressure in the range of 10–25 atmospheres.

10. The method of claim 9 in which oxidizing the base region top surface includes oxidizing a layer having a thickness in the range of 50 to 250 Angstroms (Å).

11. The method of claim 4 in which the formation of the protective oxide layer overlying the base region top surface includes depositing a thin layer of oxide through a chemical vapor deposition (CVD) process.

12. The method of claim 4 in which the formation of dielectric sidewalls includes:
   isotropically depositing a sidewall oxide layer;
   isotropically depositing a second nitride sidewall layer, forming a nitride/oxide stack; and
   anisotropically etching the nitride/oxide stack to form an emitter opening with nitride/oxide sidewalls.

13. The method of claim 12 in which the formation of the emitter includes:
   depositing silicon in the emitter well overlying the base region top surface;
   implanting dopant in the emitter silicon;
   annealing; and
   forming contacts to the base electrode.

14. The method of claim 1 in which the selectively deposited SiGe is deposited to a thickness in the range of 500 to 1000 Å.

* * * * *